(12) United States Patent
Lin (10) Patent No.: US 6,978,829 B1
(45) Date of Patent: Dec. 27, 2005

(54) RADIATOR ASSEMBLY

(75) Inventor: Hsin-Cheng Lin, Taipei (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 0 days.

(21) Appl. No.: 10/948,158

(22) Filed: Sep. 24, 2004

(51) Int. Cl.[7] .............................................. F28D 15/00
(52) U.S. Cl. ........................ 165/104.33; 165/104.21; 361/697; 361/700; 257/715; 174/15.2
(58) Field of Search ...................... 165/104.21, 104.33, 165/104.26, 80.3, 185; 361/699, 700; 257/714–716

(56) References Cited

U.S. PATENT DOCUMENTS

| | | | | |
|---|---|---|---|---|
| 6,102,110 | A * | 8/2000 | Julien et al. | 165/104.33 |
| 6,189,601 | B1 * | 2/2001 | Goodman et al. | 165/80.3 |
| 6,542,364 | B2 * | 4/2003 | Lai et al. | 361/697 |
| 6,625,021 | B1 * | 9/2003 | Lofland et al. | 361/697 |
| 6,651,734 | B1 * | 11/2003 | Liu | 165/80.3 |
| 6,796,373 | B1 * | 9/2004 | Li | 165/104.21 |
| 2003/0019610 | A1 * | 1/2003 | Liu | 165/80.3 |
| 2003/0173061 | A1 * | 9/2003 | Lai et al. | 165/80.4 |
| 2003/0230398 | A1 * | 12/2003 | Lee et al. | 165/104.21 |
| 2004/0194310 | A1 * | 10/2004 | Lin et al. | 29/890.03 |

FOREIGN PATENT DOCUMENTS

| | | | | |
|---|---|---|---|---|
| TW | 471657 | * | 1/1991 | 165/104.33 |
| TW | 521844 | * | 2/2003 | 165/104.33 |
| TW | 528179 | * | 4/2003 | 165/104.33 |

* cited by examiner

Primary Examiner—Terrell Mckinnon (57) ABSTRACT

A radiator assembly comprises a radiator and a plurality of heat guiding tubes with a bent part respectively. The radiator is provided with a plurality of heat dissipation plates, a plurality of joining parts and a plurality of piercing parts. The heat guiding tubes are joined to the piercing parts with the joining parts being fixedly attached with the bent part respectively. Heat conduction between the heat guiding tubes and the radiator can be enhanced greatly and effectively.

3 Claims, 12 Drawing Sheets

(PRIOR ART)

FIG 1

(PRIOR ART)

RADIATOR ASSEMBLY

BACKGROUND OF THE INVENTION

1. Field of the Invention

The present invention is related to a radiation assembly and particularly to a structure set up with a radiator and heat guiding tubes.

2. Brief Description of the Related Art

Figure 1:
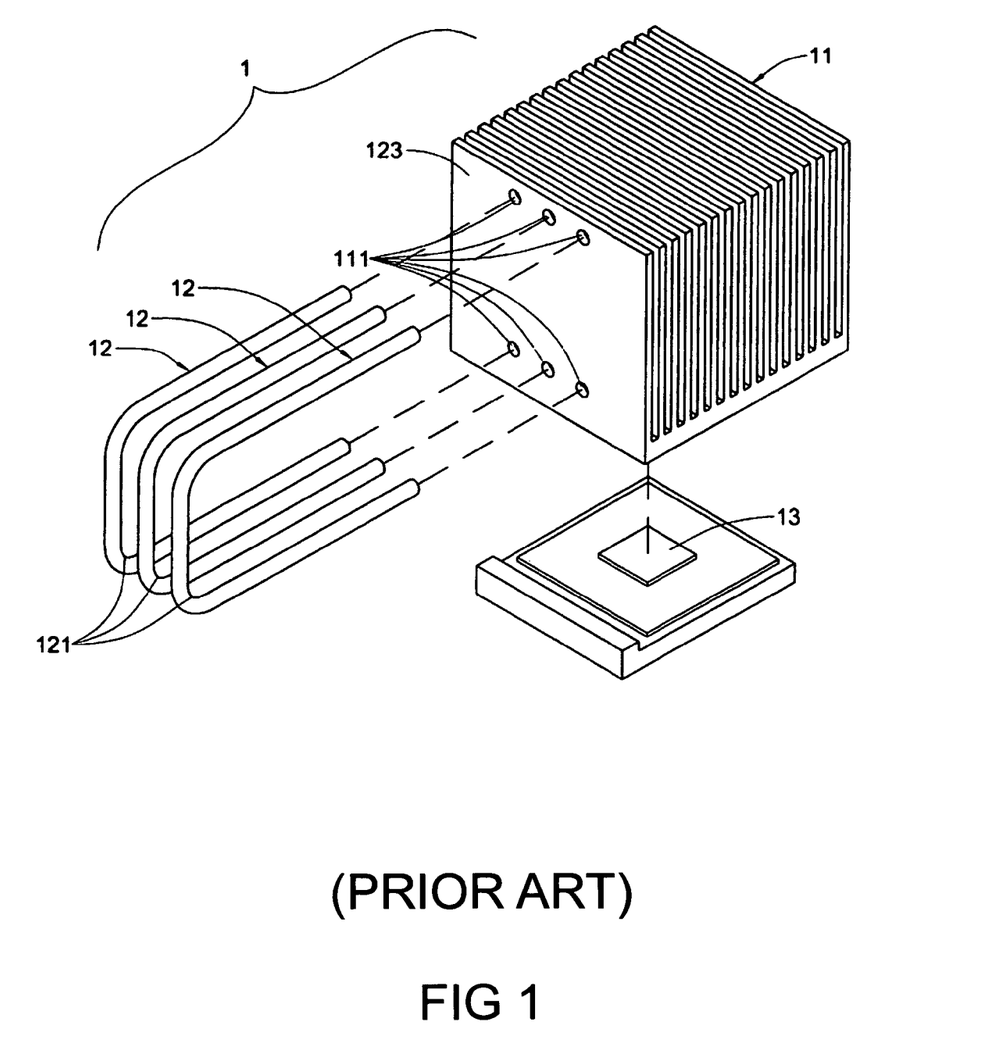
FIG. 1 is an exploded perspective view of a conventional radiator.

Referring to FIG. 1, the conventional radiator assembly has a radiator 11 with fitting holes 111 and the fitting holes 111 are joined with heat guiding tubes 12.

Figure 2:
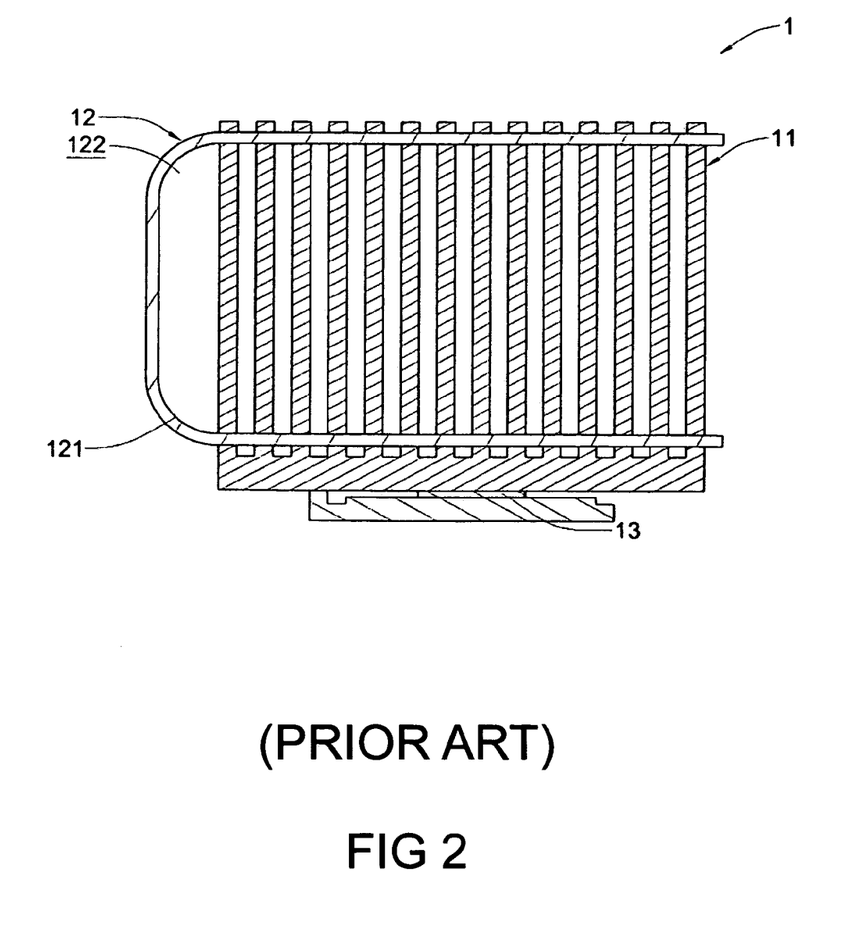
FIG. 2 is a sectional view illustrating the conventional radiator shown in FIG. 1 being assembled.
Figure 3:
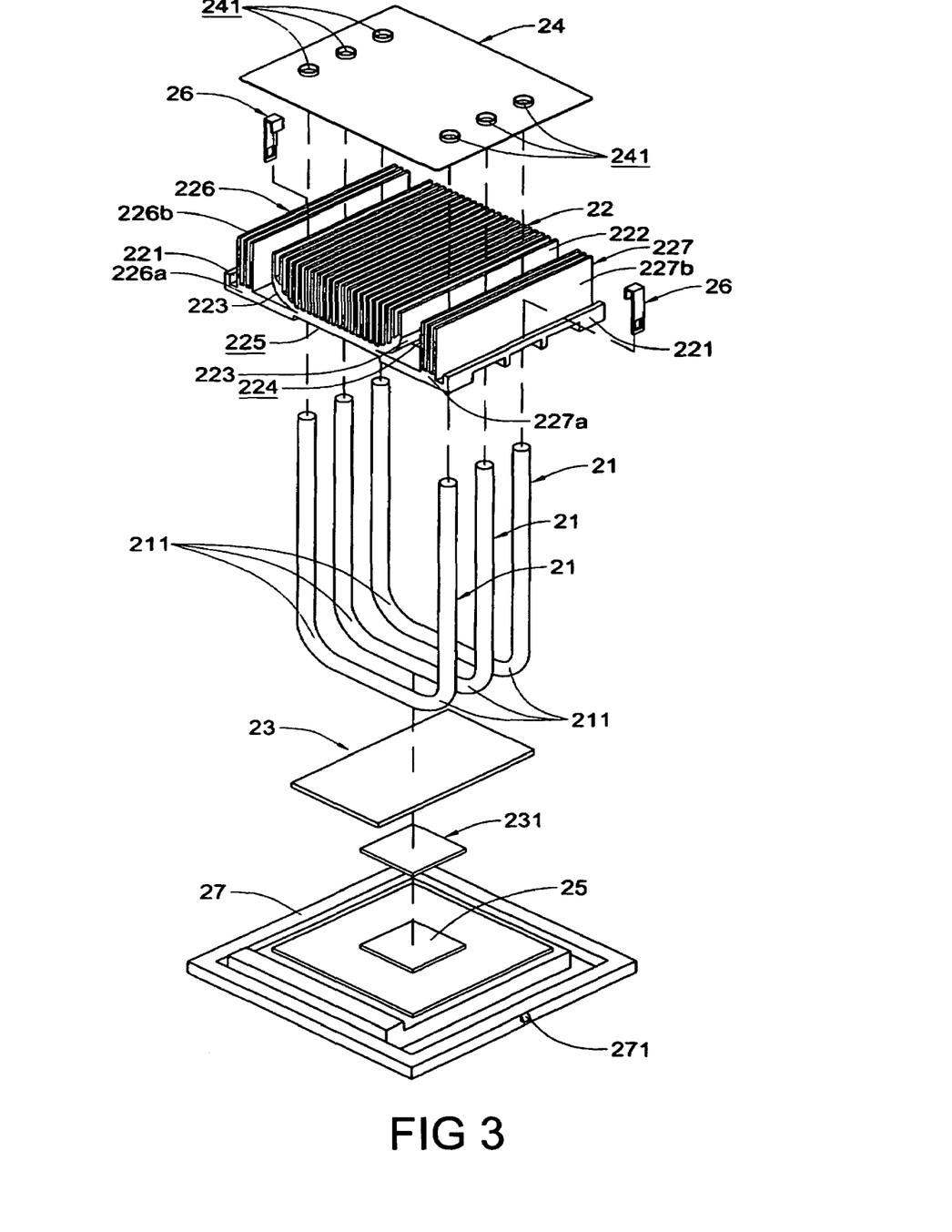
FIG. 3 is an exploded perspective view of the first preferred embodiment according to the present invention.
Figure 4:
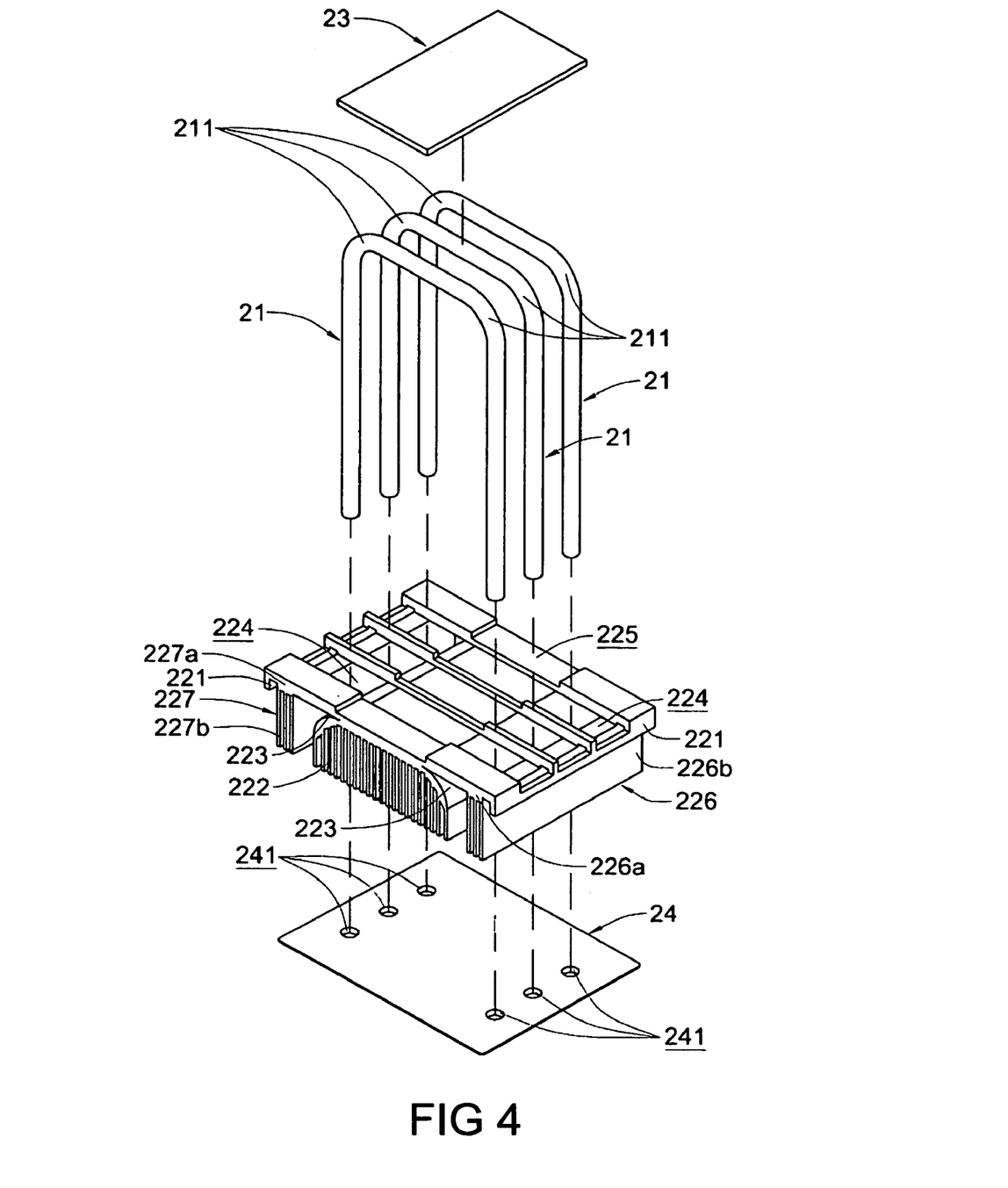
FIG. 4 is another exploded perspective view of the first preferred embodiment according to the present invention.
Figure 5:
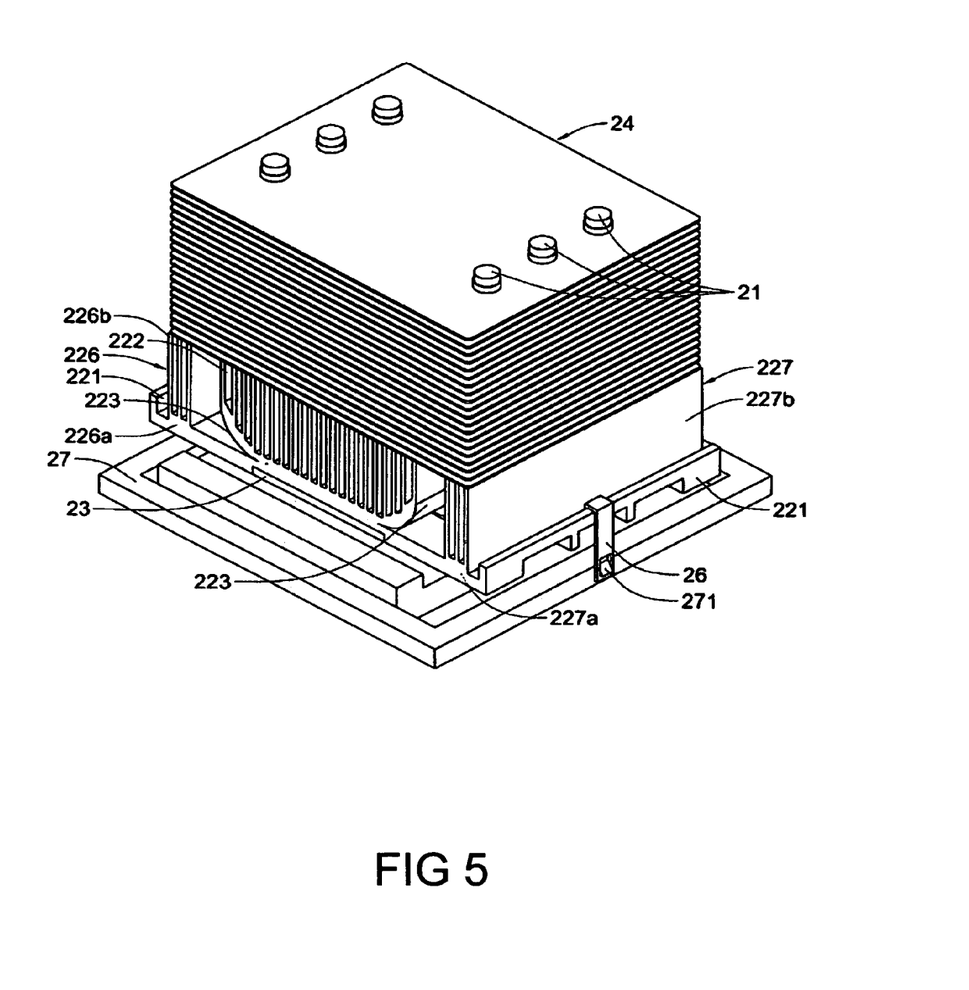
FIG. 5 is a perspective view of the first preferred embodiment according to the present invention.
Figure 6:
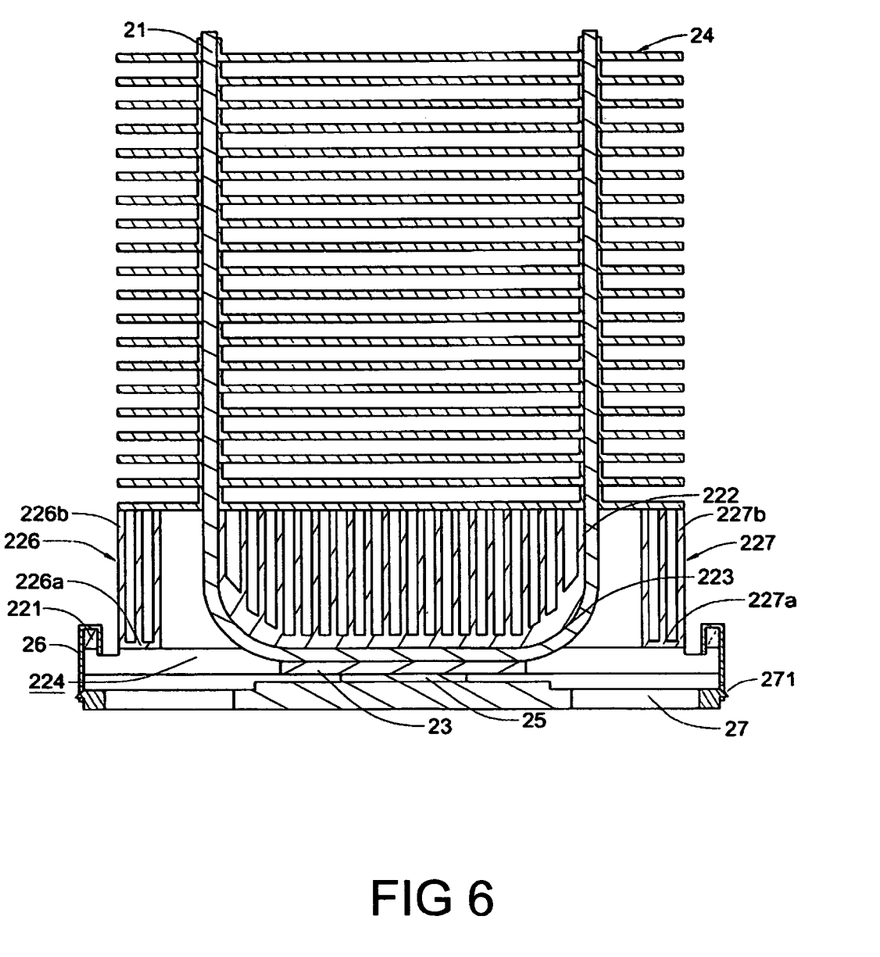
FIG. 6 is a sectional view of the first preferred embodiment according to the present invention.

Referring to FIG. 2 in company with FIG. 1, the heat guiding tubes 12 are fitted to the fitting holes 111 before the radiator 11 is attached to the heat generation object such as central processing unit.

Referring to FIG. 2 again, when the radiator 11 connects with the heat guiding tubes 12, the heat guiding tubes 12 have a bent part 121 respectively so that the a space 122 between the bent part 121 and outermost surface 123 of the radiator is formed and the heat guiding tubes 12 are incapable of contacting with the radiator 11 completely. Although the space 122 is an unavoidable deficiency, it is a significant factor that the radiator 11 and the heat guiding tubes 12 cannot provide a good effect of heat dissipation.

Furthermore, due to the radiator 11 being attached to the heat generation object 13 directly and most radiators being made of extruded aluminum, which provides unfavorable conduction efficiency comparing to the steel, the conventional radiator 11 is unable to dissipate the heat speedily in addition to a problem of cost.

From the foregoing, the conventional radiator assembly 1 has the following disadvantages:
1. The bent part 121 of each heat guiding tube 12 is incapable of performing heat dissipation effectively.
2. The conventional radiator, which is attached to the heat generation object 13 directly, is unable to guide the heat outward speedily.

SUMMARY OF THE INVENTION

An object of the present invention is to provide a radiator assembly in which the radiator and the heat guiding tubes can be joined to each other tightly.

Another object of the present invention is to provide a radiator assembly with which better effect of heat dissipation.

A further object of the present is to provide a radiator assembly available for being engaged with a locking tool.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Referring to FIGS. 3, 4, 5 and 6, a radiator assembly according to the present invention in the first embodiment thereof includes a plurality of heat guiding tubes 21, a radiator 22 and a fixing element 23. The heat guiding tubes 21 can be figured with a U or L shape respectively and are fixedly attached to the radiator 22 with the fixing element 23. The fixing element 23 is made of material with better heat conductivity such as copper and cooling paste 231 is provided on the fixing element 23 for being touched with a heat generation object 25. The radiator 22 comprises a plurality of heat dissipating fins 222 and both lateral sides of the radiator 22 have a first radiation part 226 and a second radiation part 227 respectively with the first radiation part 226 having a base 226a and a plurality of cooling fins 226b and the second radiation part 227 having a base 227a and a plurality of cooling fins 227b. More than one joining part 223 are provided at conjunctions of the radiator 22 and the heat guiding tubes 21 such that the joining part 223 can be joined to bent parts 211 of the heat guiding tubes 21.

While the radiator assembly of the present invention is set up, the heat guiding tubes 21 are arranged to pass through piercing parts 224 in the radiator 22 and fit with fitting holes 241 of the heat dissipation fin 24. The fixing element 23 is fixedly attached to the recess 225 of the radiator 22 and a locking element 26 engages with a receiving part 221 of the radiator 22 and a hook part 271 of the base 27. Meanwhile, the radiator 22 is placed on the base 27 and finally, the fixing element 23 is attached to the heat generation object 25.

Figure 7:
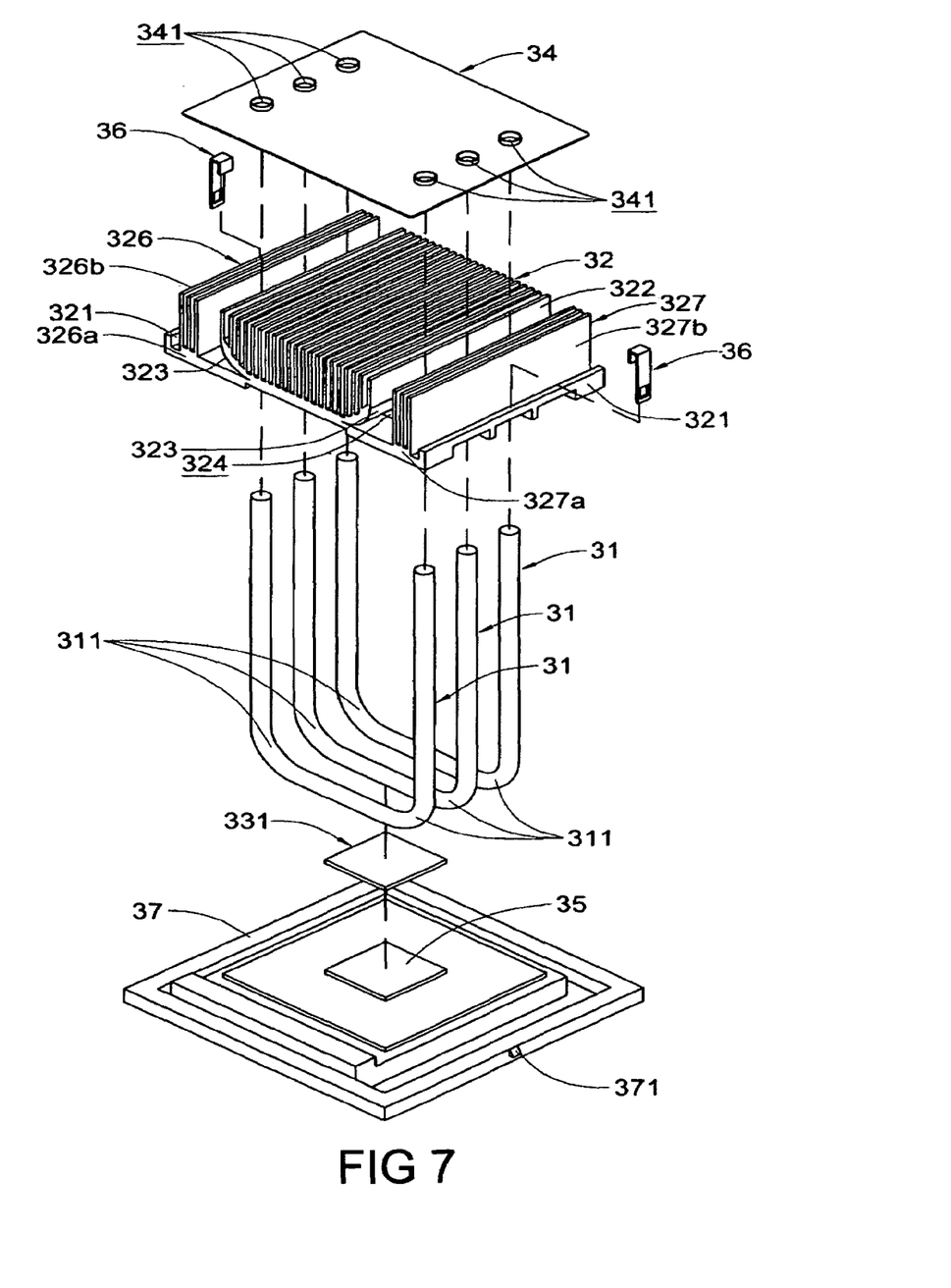
FIG. 7 is an exploded perspective view of the second preferred embodiment according to the present invention.
Figure 8:
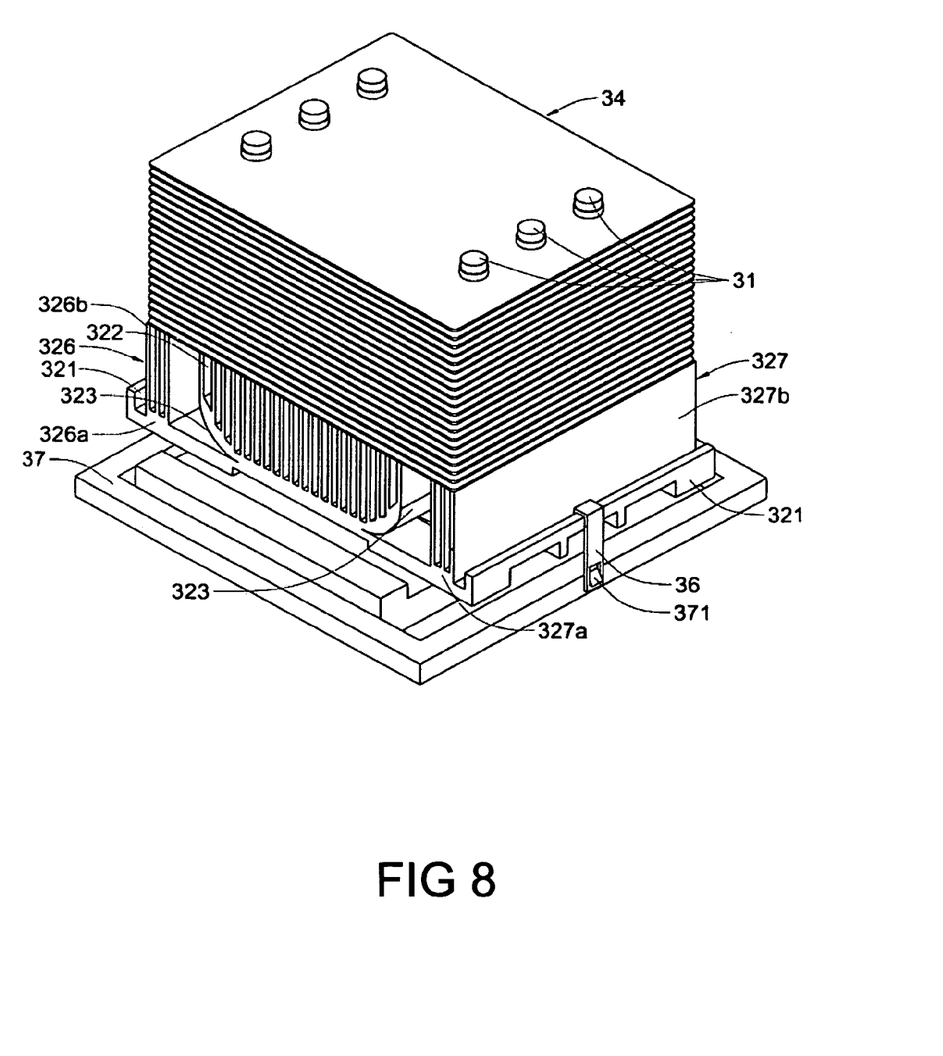
FIG. 8 is a perspective view of the second preferred embodiment according to the present invention.
Figure 9:
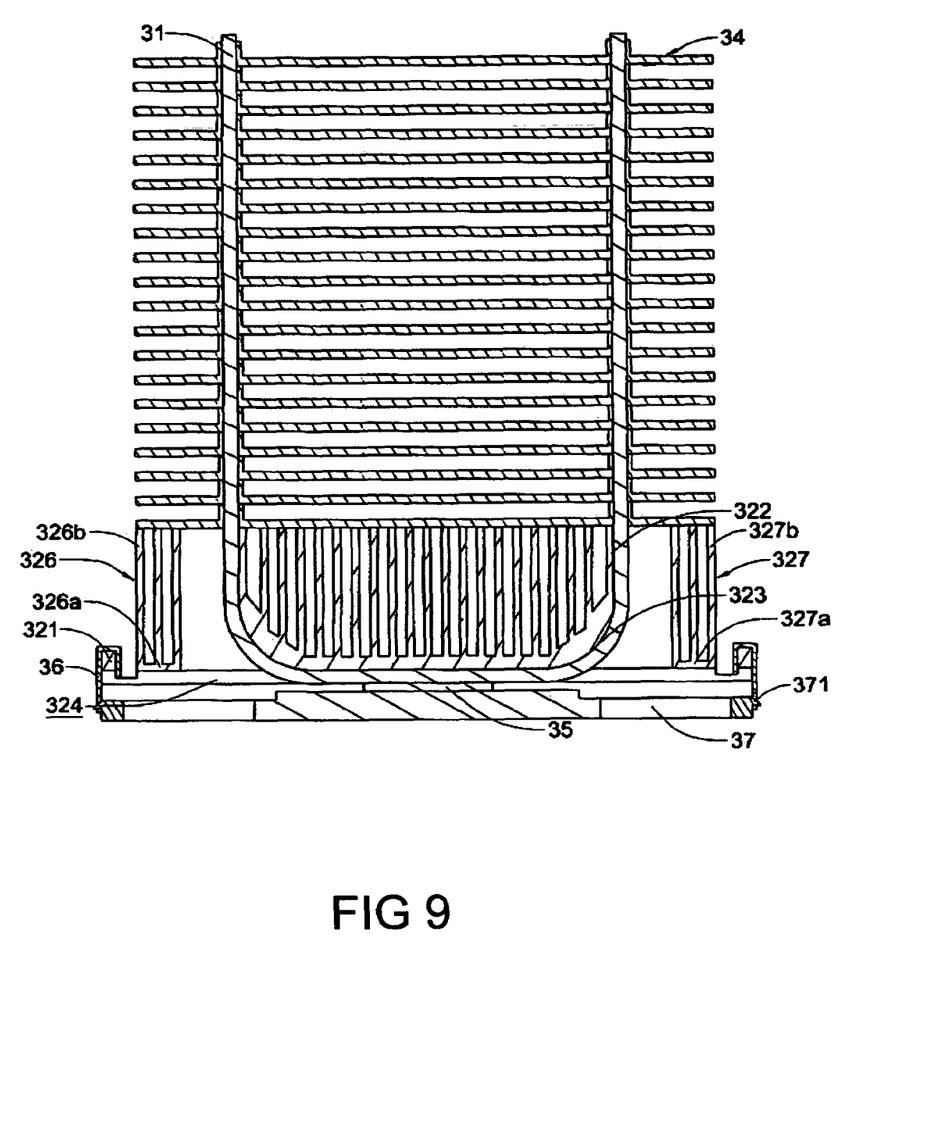
FIG. 9 is a sectional view of the second preferred embodiment according to the present invention.

Referring to FIGS. 7, 8 and 9, the second preferred embodiment of the present invention is illustrated. The radiator assembly in the second preferred embodiment includes a plurality of heat guiding tubes 31 and a radiator 32. The heat guiding tubes 31 can be figured with a U or L shape respectively and are fixedly attached to the radiator 32. The cooling paste 231 is provided on the heat guiding tube 31 for being touched with a heat generation object 35. The radiator 32 comprises a plurality of heat dissipating fins 322 and both lateral sides of the radiator 32 have a first radiation part 326 and a second radiation part 327 respectively with the first radiation part 326 having a base 326a and a plurality of cooling fins 326b and the second radiation part 327 having a base 327a and a plurality of cooling fins 327b. More than one joining part 323 are provided at conjunctions of the radiator 32 and the heat guiding tubes 31 such that the joining part 323 can be joined to bent parts 311 of the heat guiding tubes 31.

While the radiator assembly of the second embodiment is set up, the heat guiding tubes 31 are arranged to pass through piercing parts 324 in the radiator 32 and fit with fitting holes 341 of the heat dissipation fin 34. A fixing element is fixedly attached to a recess of the radiator 32 and a locking element 36 engages with a receiving part 321 of the radiator 32 and a hook part 371 of the base 27. Meanwhile, the radiator 32 is placed on the base 37 and, finally, the fixing element is attached to the heat generation object 35.

Figure 10:
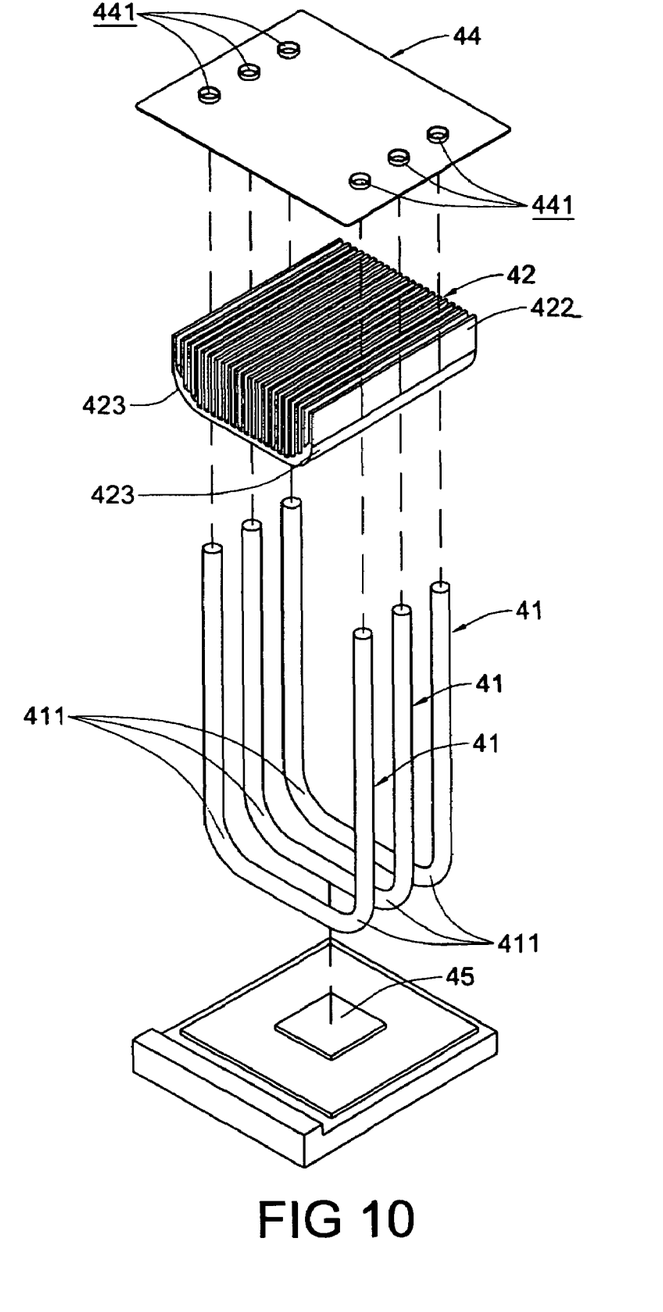
FIG. 10 is an exploded perspective view of the third preferred embodiment according to the present invention.
Figure 11:
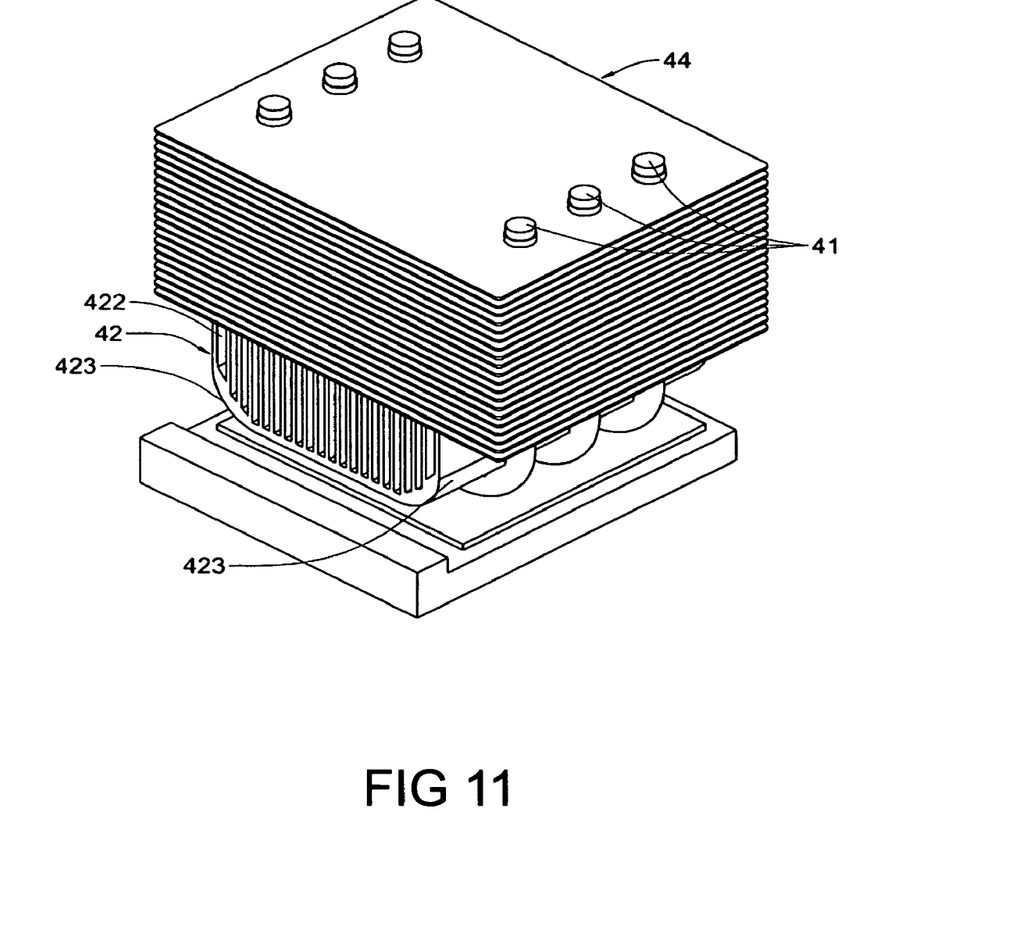
FIG. 11 is a perspective view of the third preferred embodiment according to the present invention.
Figure 12:
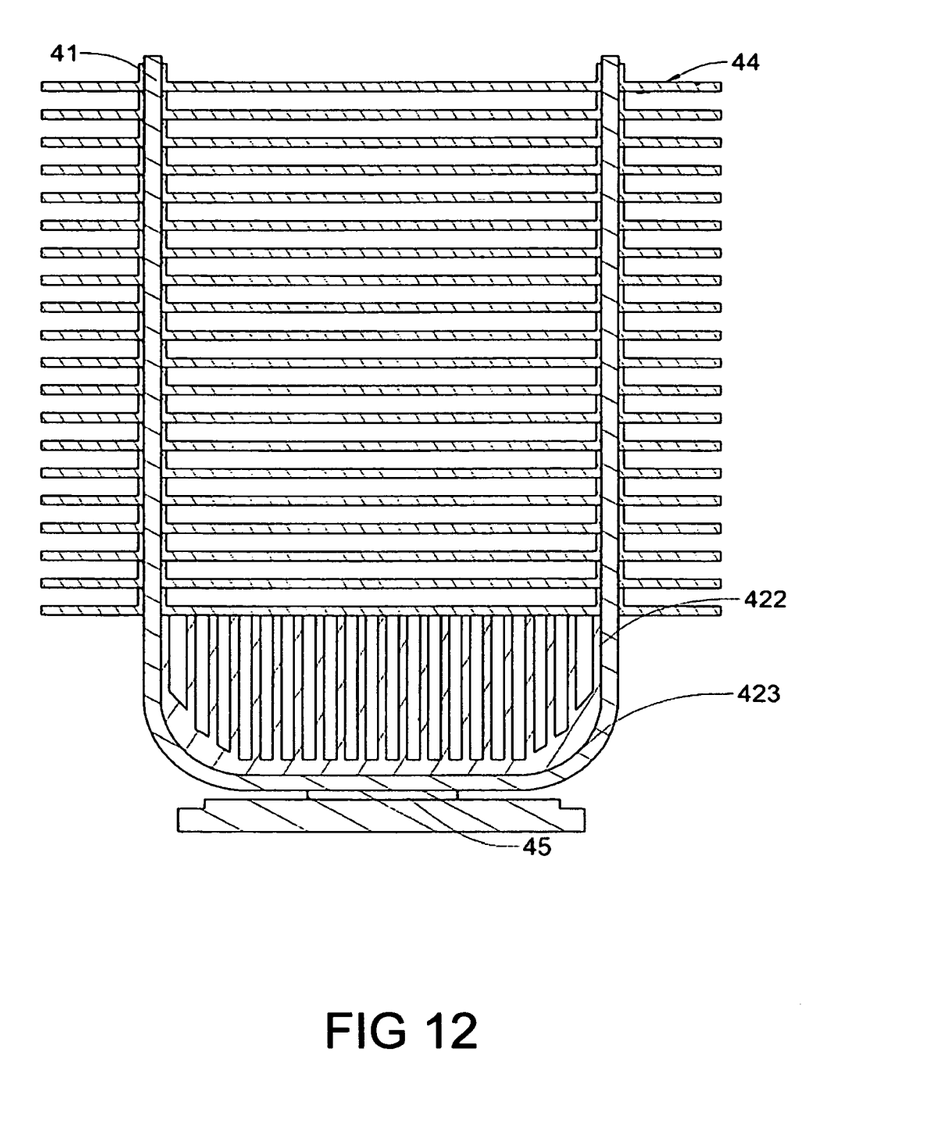
FIG. 12 is a sectional view of the third preferred embodiment according to the present invention.

Referring to FIGS. 10, 11 and 12, the third preferred embodiment of the present invention is illustrated. The radiator assembly in the third embodiment includes a plurality of heat guiding tubes 41 and a radiator 42. The heat guiding tubes 31 can be figured with a U or L shape respectively and the radiator 42 has a plurality of heat dissipation plates 422. More than one joining part 423 are provided at conjunctions of the radiator 42 and the heat guiding tubes 41 such that the joining part 423 can be joined to bent parts 411 of the heat guiding tubes 41.

While the radiator assembly of the second embodiment is set up, the heat guiding tubes 41 are joined to fitting holes 441 of the heat dissipation fins 44 via the radiator 42. Finally, the heat guiding tubes 41 are attached to the heat generation object 45.

It is appreciated that the radiator assembly of the present invention has the following features:
1. The joining parts and the heat guiding tubes are joined to each other instead of a clearance being between the radiator and the heat guiding tubes in the conventional radiator assembly so that heat dissipation effect can be enhanced greatly.
2. The fixing element or the heat guiding tubes are attached to the heat generation object directly so that the heat from heat generation object can be dissipated quickly.
3. The radiator has the first heat dissipation part and the second heat dissipation part to enhance the heat dissipation effect.

While the invention has been described with referencing to preferred embodiments thereof, it is to be understood that modifications or variations may be easily made without departing from the spirit of this invention, which is defined by the appended claims.

What is claimed is:

1. A radiator assembly, comprising:
a radiator with two lateral sides, providing a plurality of first heat dissipation fins at the middle section thereof and a recess being disposed at the bottom thereof;
a radiation part, providing a plurality of cooling fins being disposed near two lateral sides of the radiator and a piercing part being disposed between the radiator and the respective radiation part;
a plurality of U shaped guiding tubes, two lateral sections thereof passing through the respective piercing part and close section thereof being disposed under the radiator; and
a fixing element, being fixedly attached to the recess to secure the heat guiding tubes in place and contacting with a heat generation object underneath;
characterized in that the lateral sides of the radiator each has a curved joined part corresponding to a bent part between each of the two lateral sections and the close end of each of the guiding tubes such that the joined part is joined to the bent part without clearance; a plurality of second heat dissipation fins are piled on the radiator with a plurality of fitting holes for being passed through the lateral sections of guiding tubes; and the fixing element touches a heat generation object underneath directly.

2. A radiator assembly, comprising:
a radiator with two lateral sides, providing a plurality of first heat dissipation fins at the middle section thereof and a recess being disposed at the bottom thereof;
a radiation part, providing a plurality of cooling fins being disposed near two lateral sides of the radiator and a piercing part being disposed between the radiator and the respective radiation part; and
a plurality of U shaped guiding tubes, two lateral sections thereof passing through the respective piercing part and close section thereof being disposed under the radiator;
characterized in that the lateral sides of the radiator each has a curved joined part corresponding to a bent part between each of the two lateral sections and the close end of each of the guiding tubes such that the joined part is joined to the bent part without clearance; a plurality of second heat dissipation fins are piled on the radiator with a plurality of fitting holes for being passed through the lateral sections of guiding tubes; and the closed sections of the heat guiding tubes touch a heat generation object underneath directly.

3. A radiator assembly, comprising:
a radiator with two lateral sides, providing a plurality of first heat dissipation fins at the middle section thereof and a recess being disposed at the bottom thereof;
a plurality of U shaped guiding tubes, two lateral sections thereof passing through the respective piercing part and close section thereof being disposed under the radiator;
characterized in that the lateral sides of the radiator each has a curved joined part corresponding to a bent part between each of the two lateral sections and the closed section of each of the guiding tubes such that the joined part is joined to the bent part without clearance; a plurality of second heat dissipation fins are piled on the radiator with a plurality of fitting holes for being passed through the lateral sections of guiding tubes; and the closed section of each of the heat guiding tubes touches a heat generation object underneath directly.

* * * * *